US008222797B2

(12) United States Patent
Blume et al.

(10) Patent No.: US 8,222,797 B2
(45) Date of Patent: Jul. 17, 2012

(54) INFORMATION PROCESSOR AND METHOD FOR THE PRODUCTION THEREOF

(75) Inventors: Heinrich-Jochen Blume, Darmstadt (DE); Bernhard Gottlieb, München (DE); Andreas Kappel, Brunnthal (DE); Robert Wolfgang Kissel, Egelsbach (DE); Karl-Heinz Mittenbühler, Griesheim (DE); Tim Schwebel, München (DE); Carsten Wallenhauer, Schwarzheide (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/677,534

(22) PCT Filed: Aug. 27, 2008

(86) PCT No.: PCT/EP2008/061180
§ 371 (c)(1),
(2), (4) Date: Jun. 1, 2010

(87) PCT Pub. No.: WO2009/033949
PCT Pub. Date: Mar. 19, 2009

(65) Prior Publication Data
US 2010/0289378 A1 Nov. 18, 2010

(30) Foreign Application Priority Data
Sep. 11, 2007 (DE) .................. 10 2007 043 263

(51) Int. Cl.
*H01L 41/08* (2006.01)

(52) U.S. Cl. ......... 310/330; 310/332; 310/367; 310/368

(58) Field of Classification Search .................. 310/328, 310/367, 329–332, 339, 368
See application file for complete search history.

(56) References Cited

U.S. PATENT DOCUMENTS

| 1,802,782 | A | * | 4/1931 | Sawyer | 310/331 |
|---|---|---|---|---|---|
| 3,500,451 | A | | 3/1970 | Yando | |
| 4,362,407 | A | | 12/1982 | Kolm et al. | 400/124 |
| 4,399,385 | A | * | 8/1983 | Osaka et al. | 310/328 |
| 4,456,394 | A | | 6/1984 | Kolm et al. | 400/124.16 |
| 4,769,570 | A | * | 9/1988 | Yokoyama et al. | 310/332 |
| 5,135,312 | A | * | 8/1992 | Blake | 374/117 |
| 5,751,091 | A | * | 5/1998 | Takahashi et al. | 310/339 |
| 6,744,177 | B2 | | 6/2004 | Riedel et al. | 310/332 |
| 7,005,777 | B2 | | 2/2006 | Wright et al. | 310/328 |
| 7,102,274 | B2 | * | 9/2006 | Kita | 310/358 |
| 7,948,153 | B1 | * | 5/2011 | Kellogg et al. | 310/339 |
| 2004/0010896 | A1 | | 1/2004 | Wright et al. | 29/25.35 |

(Continued)

FOREIGN PATENT DOCUMENTS
DE 19834461 2/2000
(Continued)

OTHER PUBLICATIONS

International Search Report and Written Opinion for Application No. PCT/EP2008/061180 (14 Pages), Jan. 7, 2009.

(Continued)

*Primary Examiner* — Mark Budd
(74) *Attorney, Agent, or Firm* — King & Spalding L.L.P.

(57) ABSTRACT

An information converter has at least two material layers having polygonal base surfaces, which are connected to each other in a shear-rigid way, wherein at least in one material layer a change of length can be induced. The polygonal base surface has at least two different interior angles.

30 Claims, 3 Drawing Sheets

U.S. PATENT DOCUMENTS

| | | | |
|---|---|---|---|
| 2004/0135472 A1 | 7/2004 | Kita et al. | 310/328 |
| 2006/0181179 A1 | 8/2006 | Wood et al. | 310/367 |

FOREIGN PATENT DOCUMENTS

| | | |
|---|---|---|
| DE | 10023556 | 11/2001 |
| DE | 102004063180 | 7/2006 |
| EP | 0993055 | 4/2000 |
| EP | 1391305 | 2/2004 |
| JP | 9148642 | 6/1997 |
| JP | 2001327179 | 11/2001 |

OTHER PUBLICATIONS

Wood et al. "Optimal Energy Density Piezoelectric Bending Actuators," Sensors and Actuators A, Elsevier Sequoia S. A., Lausanne, CH, vol. 119, No. 2, pp. 476-488 XP004852190 (13 Pages), Apr. 13, 2005.

Hong et al. "Active Control of Resiliently Mounted Beams Using Triangular Actuators," Journal of Sound and Vibration, London, GB, vol. 301 No. 1-2, pp. 297-318 XP005735714 (22 pages), Jan. 18, 2007.

* cited by examiner

FIG 1 Stand der Technik
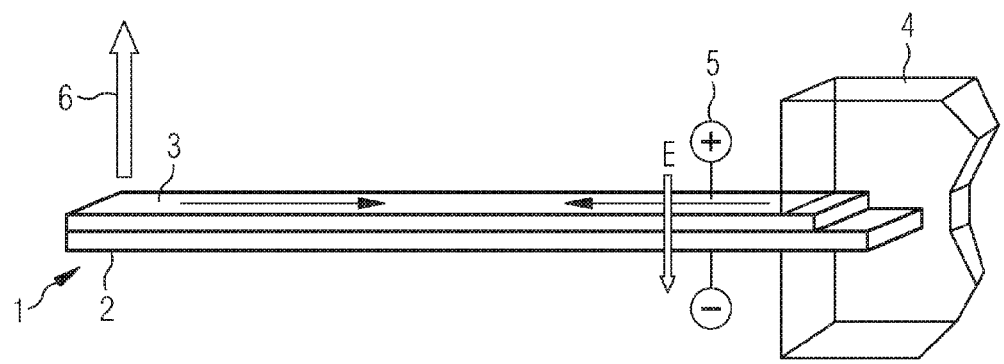
FIG 2
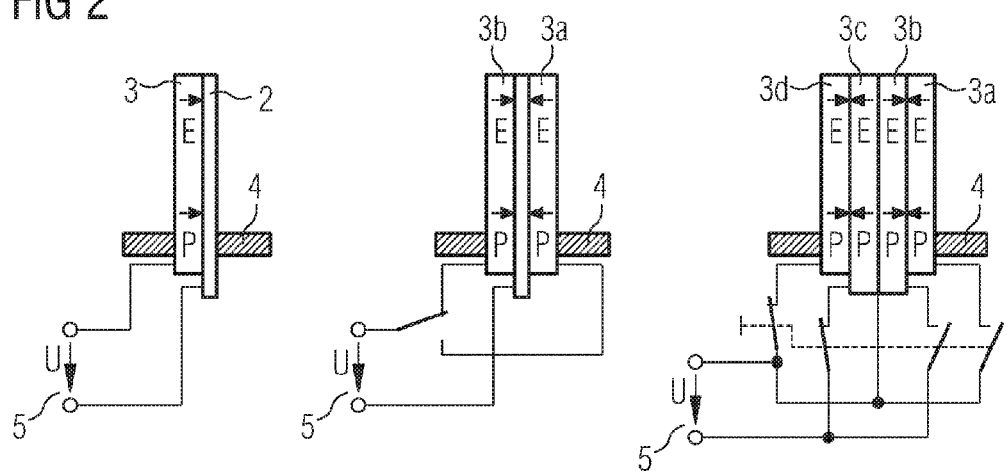

Stand der Technik

US 8,222,797 B2

INFORMATION PROCESSOR AND METHOD FOR THE PRODUCTION THEREOF

CROSS-REFERENCE TO RELATED APPLICATIONS

This application is a U.S. National Stage Application of International Application No. PCT/EP2008/061180 filed Aug. 27, 2008, which designates the United States of America, and claims priority to German Application No. 10 2007 043 263.3 filed Sep. 11, 2007, the contents of which are hereby incorporated by reference in their entirety.

TECHNICAL FIELD

The invention relates to an information converter which comprises at least two material layers having polygonal base surfaces, which are connected to each other in a shear-rigid way, and wherein at least in one material layer a change of length can be induced. Such information converters are used in automation engineering either as sensors or as actuators.

BACKGROUND

From the prior art it is known for at least two material layers with different expansion behaviors to be connected to each other in a shear-rigid way to form a composite material. The expansion behavior can be influenced piezoelectrically, magnetostrictively, electrostrictively, thermally or by means of shape memory alloys. The different expansions of the two material layers then causes a bending of the composite material, which can be induced electrically or thermally. The external shape of such a composite material according to the prior art is always cuboid, the boundary surface between the two material layers always running parallel to the plane of maximum expansion. The line of intersection of the two materials consequently runs inside the narrow side. The base surface in the plane of maximum expansion of the cuboid is always rectangular or square.

In order to make the relative bending of the composite material usable as an information converter, a narrow side is usually clamped in a holder. This then defines the zero point of movement.

In an actuator, the movement of the strip on the narrow side opposite the holder can then be picked up. In a sensor, an electrical signal can be generated from the movement of the narrow side opposite the holder, or a thermal loading is converted into a mechanical movement.

In order to increase the mechanical output or work capacity of an actuator, it is known from the prior art for a plurality of material layers to be connected to each other in a shear-rigid way. Care should be taken here to ensure that the respective deformations of the strips do not cancel one another out but add to one another. In this way, the force available is multiplied.

SUMMARY

Taking this prior art as its starting point, according to various embodiments the work capacity and/or the operational stability of a known information converter can be improved.

According to an embodiment, an information processor may comprise at least two material layers having polygonal base surfaces, which are connected to each other in a shear-rigid way, and wherein at least in one material layer a change of length can be induced, characterized in that the polygonal base surface has at least two different interior angles.

According to a further embodiment, the polygonal base surface may comprise at least one approximately right interior angle. According to a further embodiment, the polygonal base surface may comprise at least one interior angle of from about 35° to about 85°. According to a further embodiment, the polygonal base surface may comprise at least one interior angle of from about 55° to about 80°. According to a further embodiment, the polygonal base surface may have 3 or 4 vertices. According to a further embodiment, the polygonal base surface may have 3 vertices. According to a further embodiment, the cross section of the at least 2 material layers may decrease along the maximum extension of the polygonal base surface. According to a further embodiment, a mechanical holder may be provided in the region of the maximum cross section of the at least 2 material layers. According to a further embodiment, at least one material layer may contain a material which exhibits a piezoelectric effect. According to a further embodiment, a device can be provided with which an electric field can be generated inside the piezoelectric material parallel or anti-parallel to the direction of polarization. According to a further embodiment, the direction of polarization of the piezoelectric material may stand essentially vertically on the boundary surface of the at least two material layers. According to a further embodiment, the piezoelectric material may contain at least one lead zirconate titanate and/or one lead magnesium niobate. According to a further embodiment, the information processor may comprises a bending actuator. According to a further embodiment, the information processor may comprise a sensor. According to a further embodiment, the information processor may be a temperature sensor. According to a further embodiment, the information processor may be an acceleration sensor.

According to another embodiment, in a method for the production of an information processor, at least 2 material layers are connected to each other in a shear-rigid way to form a semi-finished product, wherein at least in one material layer a change of length can be induced, and subsequent separation of information processors from the semi-finished product along predetermined breaking edges, characterized in that first predetermined breaking edges are introduced essentially at right angles to the outside edges of the semi-finished product, and second predetermined breaking edges have an angle of from about 35° to about 85° relative to the first predetermined breaking edges.

According to a further embodiment of the method, third predetermined breaking edges can be provided essentially at right angles to the first predetermined breaking edges, and the second predetermined breaking edges run through the points of intersection of the first and third predetermined breaking edges. According to a further embodiment of the method, third predetermined breaking edges can be provided which have an angle of from about −35° to about −85° relative to the first predetermined breaking edges, and the points of intersection of the second and third predetermined breaking edges come to lie essentially on the first predetermined breaking edges. According to a further embodiment of the method, the angle between the third and first predetermined breaking edges may correspond to the negative of the angle between the second and first predetermined breaking edges. According to a further embodiment of the method, the second predetermined breaking edges may have an angle of from about 55° to about 80° relative to the first predetermined breaking edges. According to a further embodiment of the method, the at least 2 material layers can be connected to each other in a shear-rigid way by means of bonding. According to a further embodiment of the method, the at least 2 material layers can be sintered to each other in a shear-rigid way.

According to yet another embodiment, a pointer instrument may comprise a bending actuator as described above.

BRIEF DESCRIPTION OF THE DRAWINGS

The invention will be illustrated in greater detail below with the aid of drawings and examples, without limiting the scope of the general inventive idea.

FIG. 1 shows a conventional bending actuator, in a perspective representation.

FIG. 2 shows variants of bending transducer designs, as can be used both in the prior art and according to various embodiments.

DETAILED DESCRIPTION

Figure 3A:
FIGS. 3A-3D shows different base surfaces for information converters according to various embodiments.

According to various embodiments, an information converter comprises at least two material layers having polygonal base surfaces, which are connected to each other in a shear-rigid way, and wherein at least in one material layer a change of length can be induced, the polygonal base surface having at least two different interior angles.

The information converter according to various embodiments has at least two material layers which are connected to each other in a shear-rigid way. This connection can be achieved, for example, by bonding, sintering or welding. Of the at least two material layers at least one must exhibit a change of length which can be induced externally by an applied signal. This signal can, for example, be an electric field, a magnetic field or a temperature change.

If only one material layer exhibits an inducible change of length, this is mounted in a shear-rigid way on a carrier material which exhibits a smaller change of length or no change of length. However, it is of course also possible for a plurality of material layers having an inducible change of length to be joined such that the mechanical stresses in the material add to one another and the bending is thereby increased. For example, two material layers having an inducible change of length can be mounted in this way on either side of a passive substrate. Alternatively, 2, 4 or 6 material layers having an inducible change of length can be mounted on one another directly without a passive carrier.

In order to make the relative bending of the at least two material layers usable for an absolution change of position, a holder is also provided in the case of the information converter according to the various embodiments, in which holder one side of the information converter is clamped. The information converter thus comprises a bending beam clamped on one side.

According to various embodiments, it was now recognized that at the point at which the maximum mechanical loading occurs, i.e. directly at the clamp, the mechanical stress can be reduced if the information converter does not have a cuboid shape with a rectangular base surface but has the shape of a prism. For the purposes of the various embodiments, the area of the free bending beam is viewed as the base surface. The area inside the clamp is largely left to the person skilled in the art.

The base surface of the prism is characterized in that it has at least two different interior angles. An interior angle of the base surface is the term that designates an angle enclosed by two sides, which lies inside the base surface. An interior angle always lies at a corner of the base surface. In the case of the base surface of a cuboid, all the interior angles are always 90°. Consequently, there is only one different interior angle. The base surface of the prism shape according to various embodiments, by comparison, has at least two different interior angles.

In one embodiment of the information converter, the base surface is chosen in the shape of an equilateral triangle. It was possible to show for a symmetrically structured bimorph bender, i.e. a composite of two identical material layers the deformation of which is added together, that, given equal deflection of the vertex, the mechanical stress at the clamping point is lower by a third than in the case of a cuboid bimorph. This is particularly advantageous where one or more material layers are composed of ceramic, since ceramic materials can accommodate only low tensile stresses. At the same time, some ceramics exhibit a strong piezoelectric effect and are therefore particularly suitable for piezoelectric information converters.

In another embodiment, the information converter has a symmetrical, quadrangular base surface in which the width at the holder is greater than the width on the side opposite to the holder. The base surface thus forms a tapering trapezium. This shape increases the load-bearing capacity of the freely swinging end of the composite material which acts as a bending beam.

If the polygonal base surface of the information converter according to various embodiments comprises at least one interior angle of approximately 90°, in one embodiment the amount of material occurring as waste in the production of the information converter can be minimized. The reasons for this are, in particular, that one information converter can be added to a further point-symmetrical information converter to form the external shape of a rectangle again.

If the interior angles are not right angles, these are chosen from the range from about 35° to about 85°, in particular from about 55° to about 80°. These ranges of angles correspond to an aspect ratio of length to width of from about 2:3 up to about 20:3. The length is measured here from the holder to the outermost freely swinging edge. The width corresponds to the line of intersection of the material layers with the mechanical clamp. The material layers preferably have a constant thickness. Since, however, in the information converters according to various embodiments, the width changes with the length, the cross section of the at least two material layers decreases along the length.

If an actuator according to various embodiments contains at least one material layer which exhibits a piezoelectric effect, it was possible to prove that, due to the basic shape according to various embodiments, the blocking force compared with the prior art is greater by a third for an actuator of the same volume. Blocking force is the term used to designate the force which is necessary to bend a fully deflected information converter back to the zero position.

The no-load deflection of unloaded actuators according to the prior art and according to the various embodiments is identical. Consequently, the quality of the actuator, i.e. the product of blocking force and deflection, is also greater by a third. In a piezoelectric bending actuator, this leads to an increased work capacity for the same consumption of piezoelectric material or to a lower consumption of material for the same work capacity. In the case of a piezoelectric sensor, an acceleration sensor for example, the electrical measurement signal is greater given the same deflection. Consequently, this gives rise to an improved signal/noise ratio and thus a greater measurement accuracy.

In order to produce a piezoelectric effect in at least one material layer, a device is provided for generating in the material an electric field parallel or anti-parallel to the polarization. This can be achieved, for example, with electrodes which are applied to the outside of the piezoelectric material layer by means of sputtering or thermal evaporation. In individual cases, an electrically conductive carrier material can also be used, to which the piezoelectric material layer is applied in a shear-rigid way.

Suitable piezoelectric materials include for example lead zirconate titanates or lead magnesium niobates or mixtures of one or more of these materials. The ceramic materials specified exhibit a particularly strong piezo effect, i.e. a particularly large change of shape as a function of the electric field. By applying the electric field anti-parallel to the polarization of the piezo material, the latter undergoes a longitudinal compression and lateral extension. When an electric field is applied parallel to the direction of polarization, the material undergoes longitudinal extension and lateral compression. Where two material layers with opposing directions of polarization are shear-rigidly connected, the composite strip thus formed undergoes amplified deformation when an electric field is applied. Of course, this amplification can also be achieved if the directions of polarization are chosen in the same direction and the electric field acts in opposing directions in each material layer.

FIG. 1 shows an information converter 1 which is embodied as a piezoelectric bending transducer. The actual converter consists of a carrier material 2 and a piezo material 3. The two material layers are connected to each other in a shear-rigid way, for example by bonding. One end is fastened in an electrically insulating holder 4. The piezoelectric material layer 3 has a conductive coating on its top side. The carrier 2 is likewise electrically conductive. The direction of polarization of the piezoelectric material 3 runs in the counter direction to the arrow E. Outside the holder 4, the free length of carrier material and piezomaterial is equal in size and has an essentially rectangular base surface. The two material layers thus form a cuboid of small thickness.

For use as an actuator, an electric voltage is applied to the holder 2 and the conductive coating of the piezoelectric material layer 3. By this means, an electric field E appears inside the material layer 3. This electric field leads to a contraction of the length of the material layer 3. The carrier material 2 is not affected by the electric field and maintains a constant length. This leads to a mechanical stress in the information converter and subsequently to the bending thereof along the direction of the arrow 6.

The information converter according to FIG. 1 can alternatively also be used as a sensor. If the sensor strip 1 is deformed along the direction of the arrow 6, for example by an acceleration force or by the arrival of another component (not shown), this leads to a compression of the top material layer 3 and an extension of the underlying material layer 2. The compression of the piezoelectric material layer 3 leads to a spatial charge separation in the crystal lattice, as a result of which an electric field E forms within the material layer. An electric voltage can consequently be measured between the electric contacts 5 on the top and bottom of the composite strip.

FIG. 2a shows the information converter from FIG. 1 in a sectional view. The diagram shows in turn the electrically conductive carrier 2 and the piezoelectric material layer 3. The two material layers are connected to each other in a shear-rigid way and clamped in the holder 4. The voltage source 5 generates an electric field E which acts parallel to the polarization of the piezo material 3. Such a structure is termed a monomorph.

FIG. 2b shows a trimorph structure. In contrast to FIG. 2a, a piezoceramic material layer 3a and 3b is applied to the two sides of the carrier layer 2. This 3-layer structure is also positioned with one end in a holder 4. When a voltage is applied to the two conductive outer surfaces of the material layers 3a, 3b, a longitudinal extension is induced in one material layer, for example 3a. Material layer 3b is then switched such that a longitudinal compression is induced there. The tip of the bending actuator will consequently move to the left in the direction of the material layer 3.

The multimorph according to FIG. 2b is constructed according to the same principle. This multimorph comprises an even number of piezoceramic material layers, 4 in the example shown in the drawing. These are designated 3a to 3d. A substrate 2 is not provided in this exemplary embodiment. The material layers 3a to 3d are switched such that when a supply voltage 5 is applied, the deformation of each of the material layers 3a to 3d on the two sides of the axis of symmetry of the stack is different. This increases the force generated by the bending actuator.

FIG. 3 shows 4 exemplary embodiments of an information converter. The base surface of the bending transducer is shown in each case. In cross section, each of the embodiments 3a to 3d can have a structure according to each of FIGS. 2a to 2c.

FIG. 3a shows a bending transducer with a base surface in the shape of an equilateral triangle. For aspect ratios of length to width of from 2:3 to 20:3, the base has an interior angle of 53° to 84°. By means of the Bernoulli bending theory, a bimorph layer structure in a triangular embodiment is compared with a rectangular structure, of equal area and volume, according to the prior art. For this purpose, the bending transducer according to various embodiments is clamped on or near the base edge of the equilateral triangle. The movement is picked up at the opposite vertex of the triangle. The height of the triangle corresponds to the length of the rectangular information converter.

It has been shown here that the maximum possible deflection of the bimorph transducer does not depend on the geometry. This deflection is calculated as $$x_0 = \frac{3}{4} \cdot \frac{E_{el}}{h} \cdot l^2$$

Here, $x_0$ designates the deflection, $E_{el}$ the electric field which prevails inside the piezoelectric material layer 3, h its thickness and l the length of the rectangular information converter or the height of the triangular information converter.

For the blocking force of the rectangular converter, the following applies:

$$F_B = \frac{3}{2} \cdot E \cdot E_{el} \cdot b \cdot \frac{h^2}{l}$$

Here, $F_B$ signifies the blocking force, E the modulus of elasticity and b the width of the clamp.

Surprisingly, it could be shown that the blocking force of the triangular converter obeys the following formula:

$$F_B = \frac{4}{2} \cdot E \cdot E_{el} \cdot b \cdot \frac{h^2}{l}$$

The blocking force of the triangular converter is a third greater than that of the converter of equal volume according to the prior art.

The product of blocking force and no-load deflection designates the quality of a bending transducer. The quality consequently has the unit of an energy and thus indicates the theoretically possible work capacity of a bending actuator or the signal voltage generated in a sensor. Since the blocking force of the information converter according to various embodiments lies one third above that of the known converter, but the no-load deflection is identical in both cases, this also gives a value for the quality criterion that lies one third higher than that of the prior art.

The mechanical normal stress at the clamp, which is induced in the composite strip by bending back to the opposite extreme position, is influenced positively by the shape of the information converter according to various embodiments. Thus, the mechanical stress of an information converter according to the prior art is $$\frac{\sigma(z)}{\varepsilon_i E} = -\frac{9}{4}\frac{z}{h}$$

By comparison, a converter according to various embodiments exhibits a mechanical stress of $$\frac{\sigma(z)}{\varepsilon_i E} = -\frac{3}{2}\frac{z}{h}$$

The mechanical normal stress in the material of the information converter is thus reduced by ⅓ in the shape according to various embodiments. This gives greater operating stability and a longer service life until the information converter fails.

The results shown here based on a piezoceramic bending actuator apply analogously also to bi-metal actuators, magnetostrictive actuators and shape-memory actuators. The results can also be assigned to the corresponding sensors.

Figure 3B:
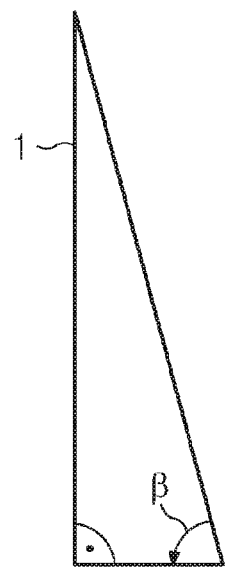

The information converter according to FIG. 3b has the shape of a right-angled triangle. As a result, it is possible to put together two bending actuators point-symmetrically to form a rectangle. This shape enables waste-free production from a rectangular semi-finished product. This information converter is clamped on the shorter cathetus to a holder 4. The movement is then picked up at the point of intersection of the longer cathetus and the hypotenuse. For aspect ratios of length to width of from 2:3 to 20:3, the base has an interior angle of from 34° to 80°.

Figure 3C:

In order to increase the mechanical load-bearing capacity at the pickup, a larger surface is provided at the end opposite the clamp in the trapezoidal information converter according to FIG. 3c. This shape is produced by shortening the triangular converter according to FIG. 3a at its vertex to a certain extent. The actual width at the pickup and thus the angle of aperture α close to the clamp will be chosen by the person skilled in the art according to the purpose required in each case. The maximum possible load-bearing capacity at the pickup has to be weighed against the rise in the quality criterion and the reduction of the mechanical stress at the clamp.

Figure 3D:

The embodiment according to FIG. 3d has two right angles, so that by reflecting a converter about a point, two converters can be put together to form one overall rectangular external shape. This again results in minimization of the waste as previously in the case of the embodiment according to FIG. 3b. This form is arrived at conceptually by shortening the triangular converter according to FIG. 3b at its vertex to a certain extent. This in turn increases the load-bearing capacity at the pickup.

To produce an information converter according to various embodiments, at least two material layers are preferably first connected to each other in a shear-rigid way to form a semi-finished product, a change of length being inducible at least in one material layer. The semi-finished product has a size corresponding to a plurality of ready-to-use information converters. These are then in a further method step separated from the semi-finished product. Occasionally, however, the person skilled in the art will also provide for separating individual parts of an information converter out of individual material layers and then joining these in a shear-rigid way to form a finished converter.

Figure 4A:
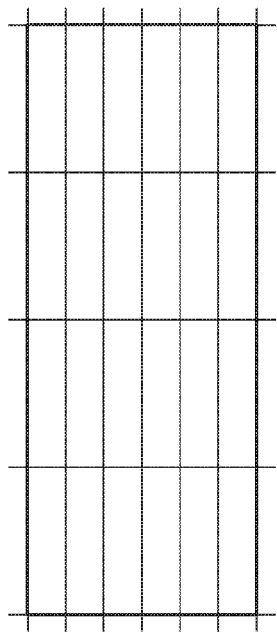
FIGS. 4A-4C shows possible cutting guides for producing the information converters according to FIGS. 1 and 3.

The separating is carried out by means of machine-separating or non-machine separating. For example, predetermined breaking points can be introduced into the material, along which points the information converters are then separated by breaking. For a bending transducer according to FIG. 1, the cutting is carried out as shown in FIG. 4a.

Figure 4B:
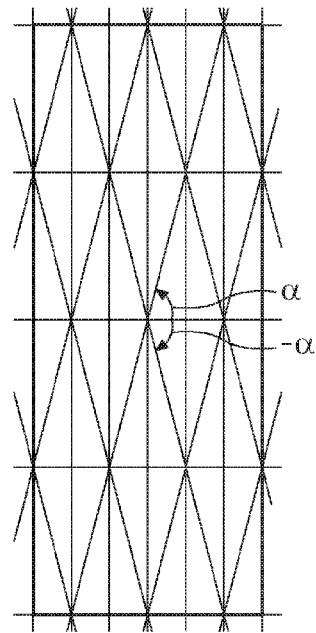

A bending transducer according to various embodiments and according to FIG. 3a can be produced as shown in FIG. 4b. Firstly, first predetermined breaking edges are introduced essentially at right angles to the outer edges of the semi-finished product. The distance between these predetermined breaking edges corresponds here to the height 1 of the finished transducer plus the clamping length, with which this transducer is inserted in the holder 4. Next, predetermined breaking edges are applied, running obliquely over the substrate. The angle here is chosen such that it corresponds to the base angle α of the transducer. According to the aspect ratio desired, the angle between the first and second predetermined breaking edges is chosen from the range from about 53° to about 85°. In the last method step, third predetermined breaking edges are introduced, which likewise run across the entire substrate. These have an angle relative to the first predetermined breaking edges corresponding to the negative of the angle between the first and second predetermined breaking edges. It should be noted when cutting that the points of intersection of the second and third predetermined breaking edges come to lie essentially on the first predetermined breaking edges. This results in good utilization of the semi-finished product, waste remaining only on the edge of same.

Figure 4C:
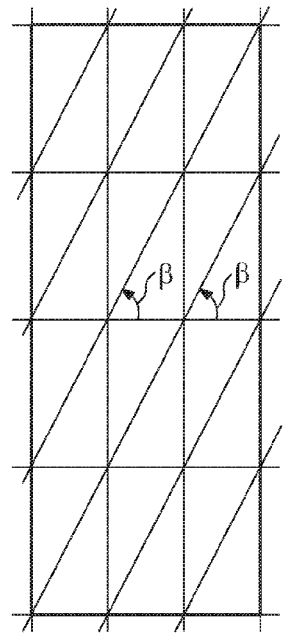

The production of an information converter according to FIG. 3b is described in FIG. 4c. Here, first and second predetermined breaking edges are firstly applied, as described in accordance with the method according to FIG. 4b. The second predetermined breaking edges enclose with the first predetermined breaking edges an angle α which corresponds to the angle between the short cathetus and the hypotenuse of the finished converter. For an aspect ratio from 2:3 to 20:3, the angle α is chosen from the range from 34° to 80°.

The third predetermined breaking edge is now introduced into the material, again at right angles to the first predetermined breaking edge, this third edge always running through the points of intersection of the first and second predetermined breaking edges. As a result, a rectangular semi-finished product can be fully separated, along the predetermined breaking edges introduced in this manner, into individual information converters without any unused waste remaining.

What is claimed is:

1. An information converter, comprising at least two material layers having polygonal base surfaces, which are connected to each other in a shear-rigid way, and wherein at least in one material layer a change of length can be induced, wherein the polygonal base surface of each of the at least two material layers has exactly four vertices and at least two different non-right angle interior angles and at least one approximately right interior angle.

2. The information converter according to claim 1, wherein the polygonal base surface comprises at least one interior angle of from about 35° to about 85°.

3. The information converter according to claim 2, wherein the polygonal base surface comprises at least one interior angle of from about 55° to about 80°.

4. The information converter according to claim 1, wherein the cross section of the at least 2 material layers decreases along the maximum extension of the polygonal base surface.

5. The information converter according to claim 1, wherein a mechanical holder is provided in the region of the maximum cross section of the at least 2 material layers.

6. The information converter according to claim 1, wherein at least one material layer contains a material which exhibits a piezoelectric effect.

7. The information converter according to claim 6, wherein a device is provided with which an electric field can be generated inside the piezoelectric material parallel or anti-parallel to the direction of polarization.

8. The information converter according to claim 6, wherein the direction of polarization of the piezoelectric material stands essentially vertically on the boundary surface of the at least two material layers.

9. The information converter according to claim 6, wherein the piezoelectric material contains at least one of at least one lead zirconate titanate and one lead magnesium niobate.

10. The information converter according to claim 1, wherein it comprises a bending actuator.

11. The information converter according to claim 1, wherein it comprises a sensor.

12. The information converter according to claim 11, wherein it is a temperature sensor.

13. The information converter according to claim 11, wherein it is an acceleration sensor.

14. An information converter, comprising at least two material layers having polygonal base surfaces, which are connected to each other in a shear-rigid way, and wherein at least in one material layer a change of length can be induced, wherein the polygonal base surface of each of the at least two material layers has exactly four vertices and at least two different non-right angle interior angles; wherein the polygonal base surfaces of the at least two material layers are substantially identical in shape.

15. The information converter according to claim 14, wherein the polygonal base surface comprises at least one approximately right interior angle.

16. The information converter according to claim 14, wherein the polygonal base surface comprises at least one interior angle of from about 35° to about 85°.

17. The information converter according to claim 16, wherein the polygonal base surface comprises at least one interior angle of from about 55° to about 80°.

18. The information converter according to claim 14, wherein the polygonal base surface has 3 or 4 vertices.

19. The information converter according to claim 14, wherein the polygonal base surface has 3 vertices.

20. The information converter according to claim 14, wherein the cross section of the at least 2 material layers decreases along the maximum extension of the polygonal base surface.

21. The information converter according to claim 14, wherein a mechanical holder is provided in the region of the maximum cross section of the at least 2 material layers.

22. The information converter according to claim 14, wherein at least one material layer contains a material which exhibits a piezoelectric effect.

23. The information converter according to claim 22, wherein a device is provided with which an electric field can be generated inside the piezoelectric material parallel or anti-parallel to the direction of polarization.

24. The information converter according to claim 22, wherein the direction of polarization of the piezoelectric material stands essentially vertically on the boundary surface of the at least two material layers.

25. The information converter according to claim 22, wherein the piezoelectric material contains at least one of at least one lead zirconate titanate and one lead magnesium niobate.

26. The information converter according to claim 14, wherein it comprises a bending actuator.

27. The information converter according to claim 14, wherein it comprises a sensor.

28. The information converter according to claim 27, wherein it is a temperature sensor.

29. The information converter according to claim 27, wherein it is an acceleration sensor.

30. The information converter according to claim 1, wherein the polygonal base surface of each of the at least two material layers is a trapezoid with exactly one pair of parallel sides.

* * * * *